US006924989B2

(12) United States Patent
Hall

(10) Patent No.: US 6,924,989 B2
(45) Date of Patent: Aug. 2, 2005

(54) WIRE AND SYSTEM COMPONENT MANAGEMENT SYSTEM

(75) Inventor: Lawrence Alton Hall, Harrisburg, PA (US)

(73) Assignee: OnQ Technologies, Inc., Middletown, PA (US)

( * ) Notice: Subject to any disclaimer, the term of this patent is extended or adjusted under 35 U.S.C. 154(b) by 0 days.

(21) Appl. No.: 10/668,884

(22) Filed: Sep. 23, 2003

(65) Prior Publication Data

US 2004/0057223 A1 Mar. 25, 2004

Related U.S. Application Data

(60) Provisional application No. 60/413,086, filed on Sep. 24, 2002.

(51) Int. Cl.[7] ................................................. H02B 1/20
(52) U.S. Cl. ........................ 361/826; 361/727; 361/728; 361/729; 361/730
(58) Field of Search ................................ 361/825, 826, 361/827, 829, 724, 725, 727, 728, 729, 730, 736, 741, 748, 752, 756; 211/41.17; 312/223.1, 223.2

(56) References Cited

U.S. PATENT DOCUMENTS

| 4,647,130 A | 3/1987 | Blair et al. |
| 4,664,456 A | 5/1987 | Blair et al. |
| 6,074,247 A | 6/2000 | Hall et al. |
| 6,132,242 A | 10/2000 | Hall et al. |
| 6,305,556 B1 * | 10/2001 | Mayer .......................... 211/26 |

* cited by examiner

Primary Examiner—Phuong T. Vu
(74) Attorney, Agent, or Firm—Barley Snyder

(57) ABSTRACT

The invention provides a wire and component management system in an enclosure having a plurality of rack mounted drawers each having an integral component board. Each component board is configured to have a plurality of mounting openings strategically positioned to allow components to be mounted thereto in various orientations. The component mounting board and drawer are movable within the rack so that they can be easily serviced. The component mounting board and drawer are hingably mounted to the rack by a hinged wire manager. The hinged wire manager is formed of two arms joined by a hinge pin. Each of the arms has wire management features and the wire managed therein is routed around the hinge pin in a loop to allow movement of the component mounting board and drawer in and out of the rack while managing a bundle of wires connected to components on the board.

4 Claims, 8 Drawing Sheets

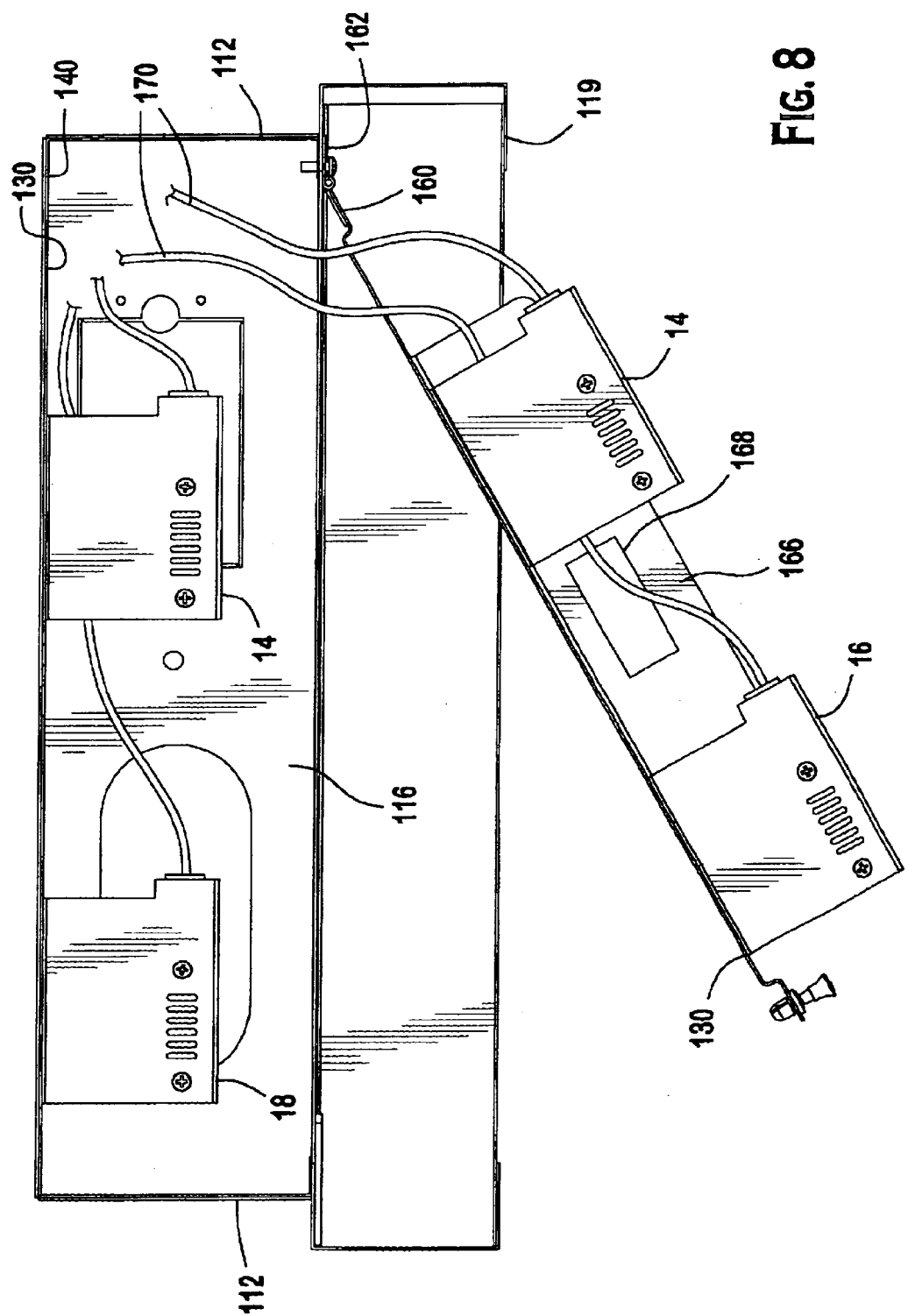

WIRE AND SYSTEM COMPONENT MANAGEMENT SYSTEM

This application claims the benefit of U.S. Provisional Application No. 60/413,086 filed Sep. 24, 2002.

FIELD OF THE INVENTION

The present invention is related to a wire and component management system and more particularly to such a system having improved wire management capabilities and allowing for component mounting in a variety of orientations.

BACKGROUND OF THE INVENTION

Structured wiring systems are currently installed in buildings whereby a number of services are typically fed into a service entrance location. These services may include for example television service, telephone, satellite communications, digital communications, closed circuit television communications, wireless links, and other entertainment or data services. These services are fed into the building utilizing any number of media such as coaxial cable, standard unshielded twisted pair cable, fiber optic cable, or other suitable conductors. The structured wiring system of the building typically consists of multiple types of cables each running from outlets in the rooms of the building to the service entrance location.

Structured wiring systems have been developed and are commercially available by OnQ Technologies. These systems allow connection between each of the various cables coming from the rooms of the building to selected services coming into the service entrance location. An enclosure for receiving the various cables of the structured wiring system and the services is located near the service entrance location. The enclosures typically provide the ability to redirect selected services to selected rooms by reconfiguring the connections within an enclosure. The enclosures are configured to receive the services along a panel. Various components such as ethernet switches, cable television splitters, music distribution modules, and other distribution devices are mounted to the panel. The services are then connected to the selected distribution devices and cables from the selected rooms are connected to the distribution device to allow the selected service to pass through the distribution device to the selected outlet in the selected room.

These structured wiring systems also typically provide the ability to remotely or intelligently control various electrical and electronic components within the building such as lighting control and climate control. Such control is accomplished through a data bus distributed throughout the outlets of the building which are connected to addressable components which control a selected device such as lights or thermostats or a security system. The data bus is connected to control and distribution components within the enclosure mounted on the panel. These control and distribution devices may be programmable through the use of a computer or other programming device.

Since a multitude of services along with potentially a large number of cables coming into the enclosure from the outlets of the building all converge at a single location in the enclosure, wire management presents a problem. Additionally, it is desirable to have the ability to expand the capabilities of the enclosure as outlets or components are added to the structured wiring system. What is needed is an improved wire and component management system that allows for the system to be expandable while maintaining wire management capabilities and ultimate flexibility in mounting system components.

SUMMARY OF THE INVENTION

The invention provides a wire and component management system in an enclosure having a plurality of rack mounted drawers each having an integral component board. Each component board is configured to have a plurality of mounting openings strategically positioned to allow components to be mounted thereto in various orientations. The component mounting board and drawer are movable within the rack so that they can be easily serviced. The component mounting board and drawer are hingably mounted to the rack by a hinged wire manager. The hinged wire manager is formed of two arms joined by a hinge pin. Each of the arms has wire management features and the wire managed therein is routed around the hinge pin in a loop to allow movement of the component mounting board and drawer in and out of the rack while managing a bundle of wires connected to components on the board.

In an alternative embodiment, the enclosure is wall mounted and has at least two levels of component mounting boards. Component mounting boards mounted on a first or inner most level are stationary while component mounting boards mounted on a second level or outer most level are hingably mounted to the enclosure. Along the hinge side of the outer most layer of component mounting boards is a wire management system having a recess which allows the wires to effectively be connected to components on the hingably mounted board. The hingably mounted board may be moved to an open or closed position while allowing the wires passing through the recess to be maintained and effectively managed.

BRIEF DESCRIPTION OF THE DRAWINGS

The invention will now be described by way of example with reference to the accompanying figures of which:

FIG. 8 is a top cross sectional view of the wire and component management system taken along the line 8—8 of FIG. 7.

DETAILED DESCRIPTION OF THE PREFERRED EMBODIMENTS

Figure 1:
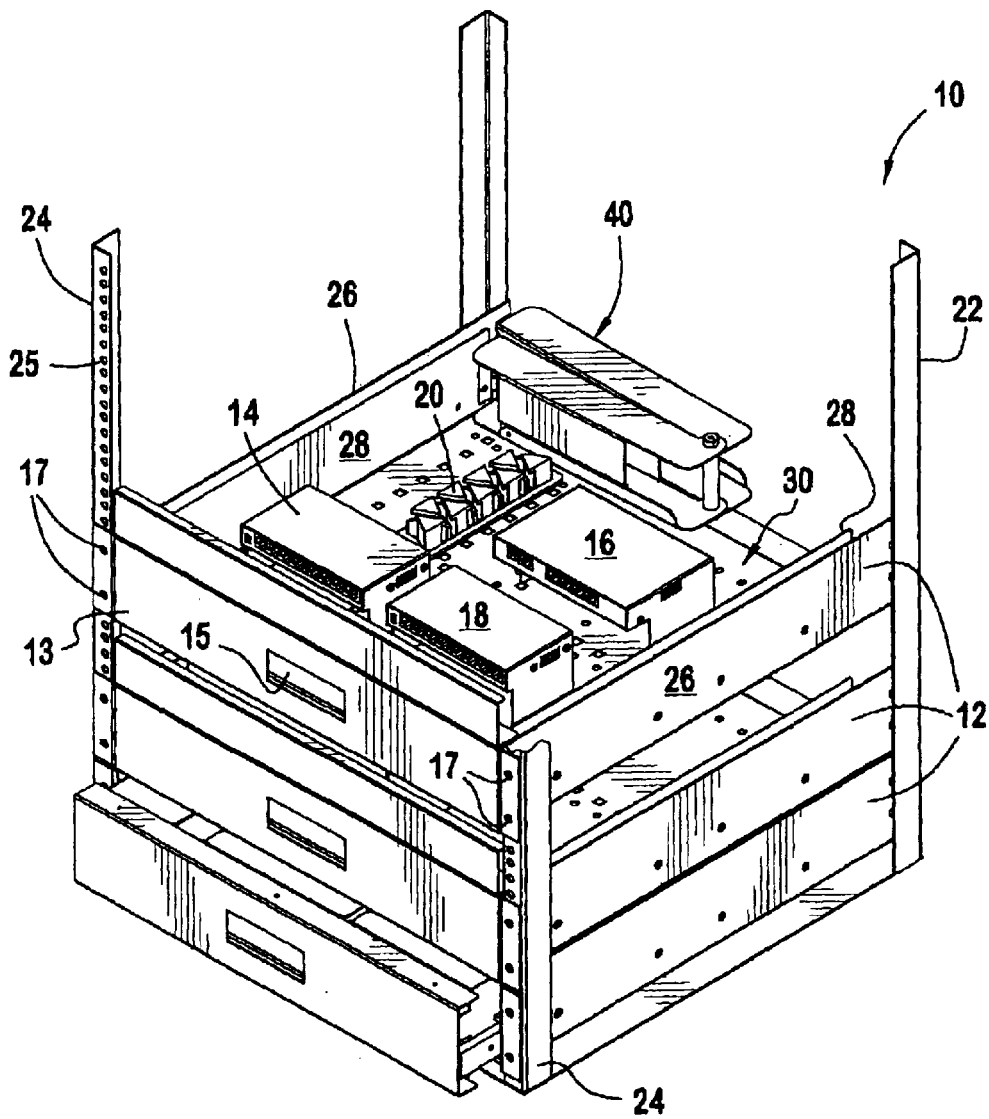
FIG. 1 is a perspective view of the wire and component management system of the present invention.

The invention will first be described generally with reference to FIG. 1 wherein the major components of a wire and component management system are shown. The wire and component management system is housed in a rack 10 which may optionally be placed within a an enclosure (not shown). The rack 10 consists of a pair of rear rack posts 22 which are joined to a pair of front rack posts 24. The rear rack posts 22 may be optionally eliminated as only the front rack posts 24 are required for mounting the drawers 12 as will be described below. The front rack posts 24 have a plurality of openings 25 formed therein for mounting purposes. A plurality of drawers 12 are mounted to the front posts 24. Each drawer 12 has a slidable portion hingably mounted near the rear post 22 by a hinged wire manager 40. Various distribution and control devices 14, 16, 18, 20 such as an ethernet switch 14, a hub 18, a router/switch 16 and a wire manager 20 are mountable on a component mounting board 30 within the drawer 12. The drawer 12 is configured to slide in and out of the rack 10. It should be understood that these components are only a few examples and that those skilled in the art will appreciate that other distribution and control devices could similarly be mounted.

Figure 2:
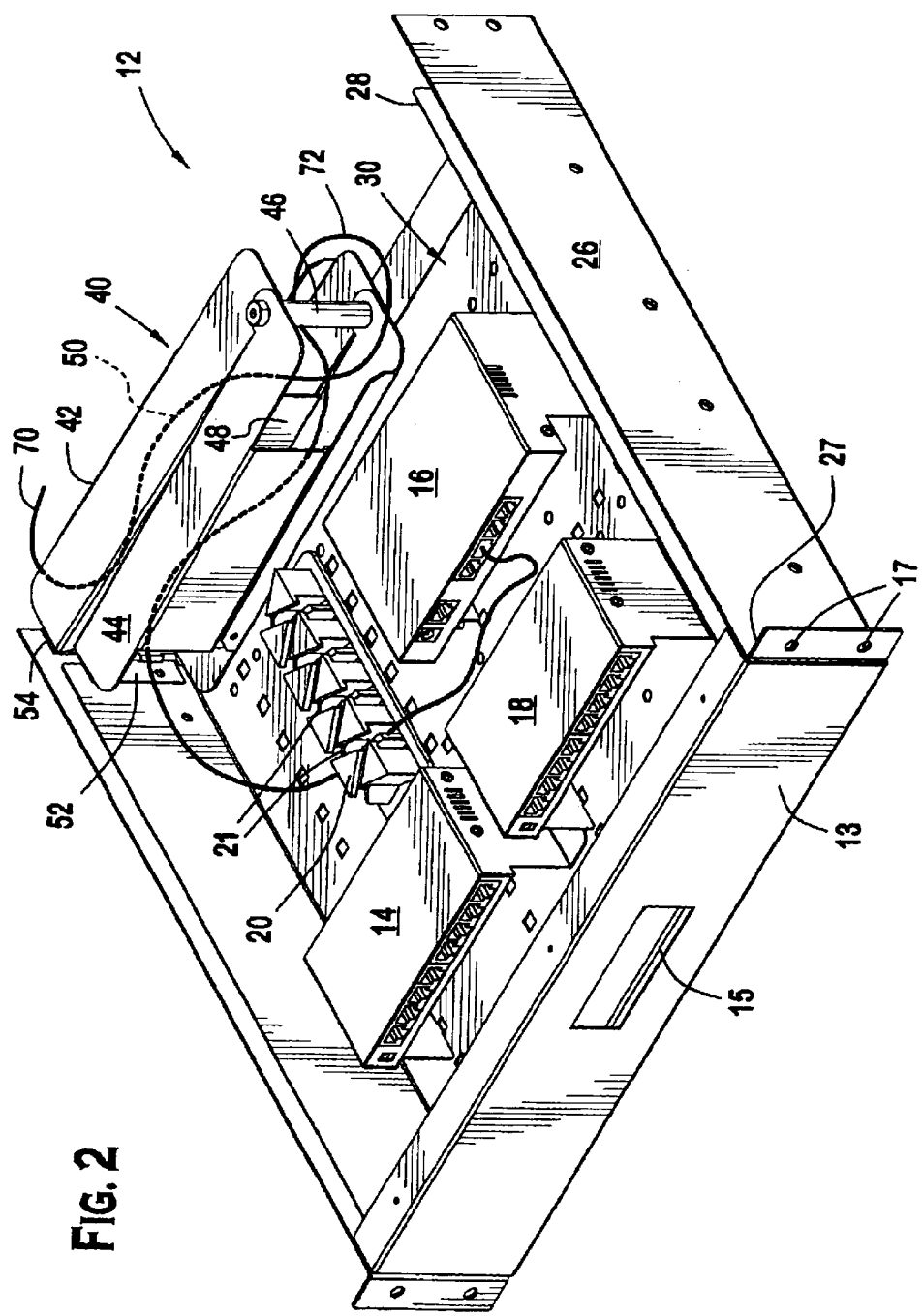
FIG. 2 is a perspective view of a drawer utilized in the wire and component management system of FIG. 1.
Figure 3:
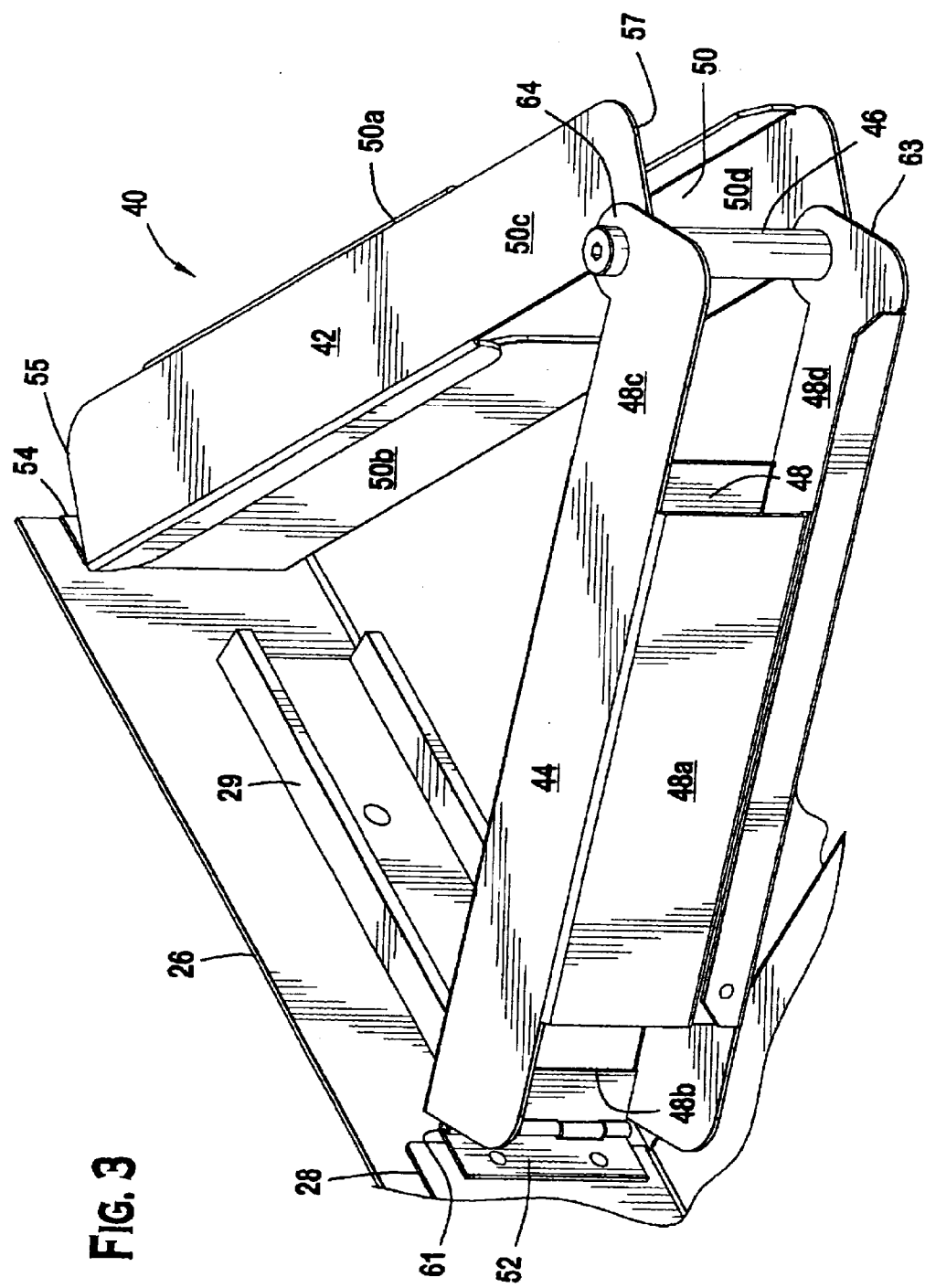
FIG. 3 is a partial exploded perspective view of the hinged wire manager utilized in the wire and component management system of FIG. 1.
Figure 4:
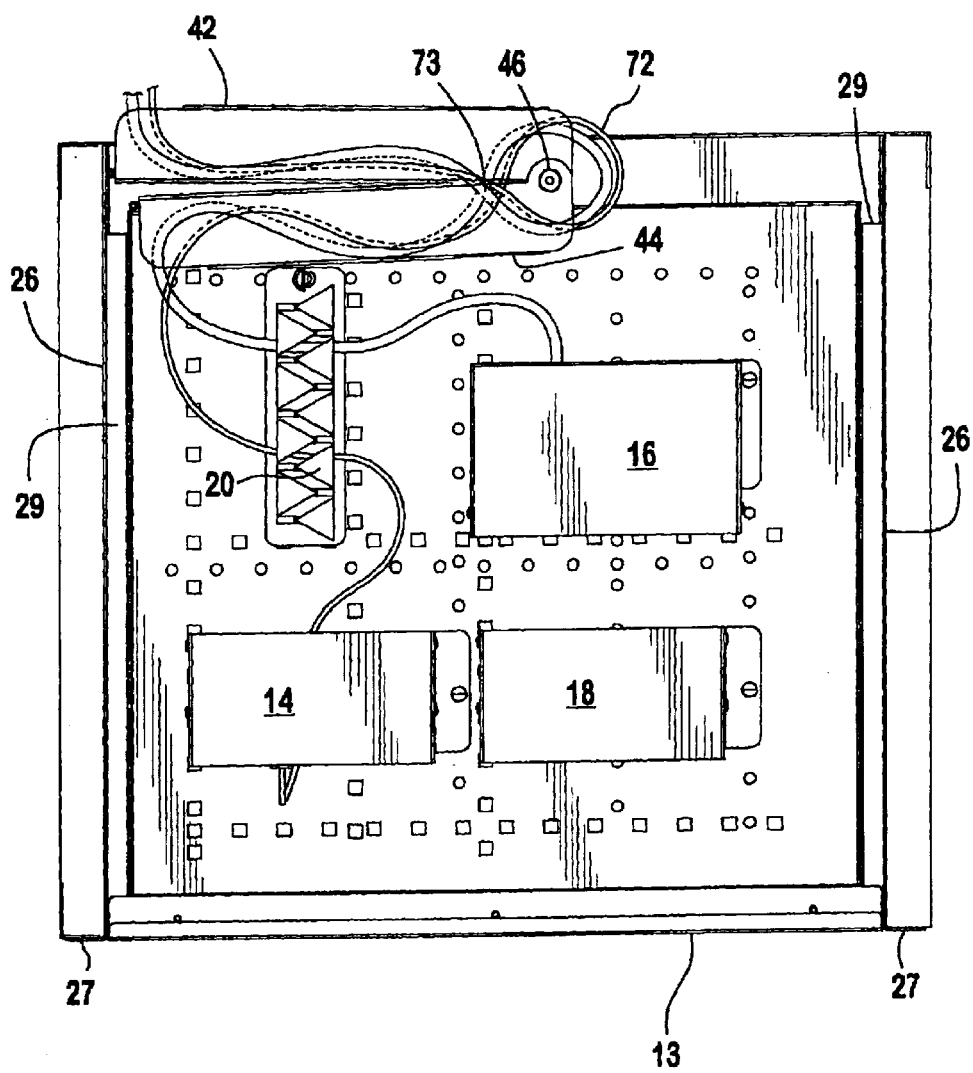
FIG. 4 is a top view of a drawer in a closed position.

Each of the major components of the system will now be described in greater detail. First, the drawers 12 will be described in greater detail with reference to FIG. 2 which shows a single drawer 12 removed from the rack 10. It should be understood that while a single drawer 12 is shown here having various distribution and control devices 14, 16, 18, 20 mounted thereon in a given configuration, these devices may be alternately mounted on the component mounting board 30 in various orientations as will described below. The drawer 12 has a pair of outer side walls 26 which are connected to each other on an underside of the drawer and each have an integral front mounting wall 27 which extends generally orthogonal to the major surface. A pair of mounting holes 17 are formed in the front mounting wall 27. A pair of movable side walls 28 are located inside of the outer side walls 26 and are slidingly mounted thereto by a rail 29 which is best shown in FIGS. 3 and 4. A front face 13 is connected to and joins each of the movable side walls 28. The front face 13 has an opening 15 formed therein for receiving a handle (not shown). The front face 13 extends beyond the movable side walls 28 to a location which is adjacent the mounting faces 17. A component mounting board 30 is positioned between the movable side walls 28 and the front face 13. It should be understood that the front face 13, the movable side wall 28 and the component mounting board 30 may alternatively be formed as a single integral component. A hinged wire manager 40 is connected to one of the movable side walls 28 by a hinge 52 at one end and is connected to an adjacent side wall 26 by another hinge 54.

The hinged wire manager 40 will now be described in greater detail with reference to FIG. 3. The hinged wire manager 40 has first and second hinge arms 42, 44. The first hinge arm 42 has a hinge 54 at a first end 55 and a wire receiving passageway 50 which extends from the first end 55 to a second end 57. The hinge 54 is connected to the side wall 26. The wire receiving passageway 50 is defined by top and bottom walls 50c and 50d which are connected by side walls 50a and 50b. Each of the top and bottom walls 50c and 50d have an opening formed therein near the second end 57 for receiving a hinge pin 46. Similarly, the second arm 44 has a hinge 52 located at a first end 61. The hinge 52 is connected to the movable side wall 28. A wire receiving passageway 48 extends from a first end 61 toward a second end 63. The wire receiving opening is defined by top and bottom walls 48c and 48d and side walls 48a and 48b. The top and bottom walls 48c and 48d have provision for receiving the hinge pin 46 at a radiused section 64 which is formed near the second end 63. The hinged wire manager 40 may be formed of conductive or non-conductive materials. It should also be understood by those reasonably skilled in the art that although the walls 48a, 48b, 48c, 48d, 50a, 50b, 50c, 50d have been described here as separate walls, it is conceivable that the arms 42 and 44 could be integrally formed of a single component construction.

Figure 6:
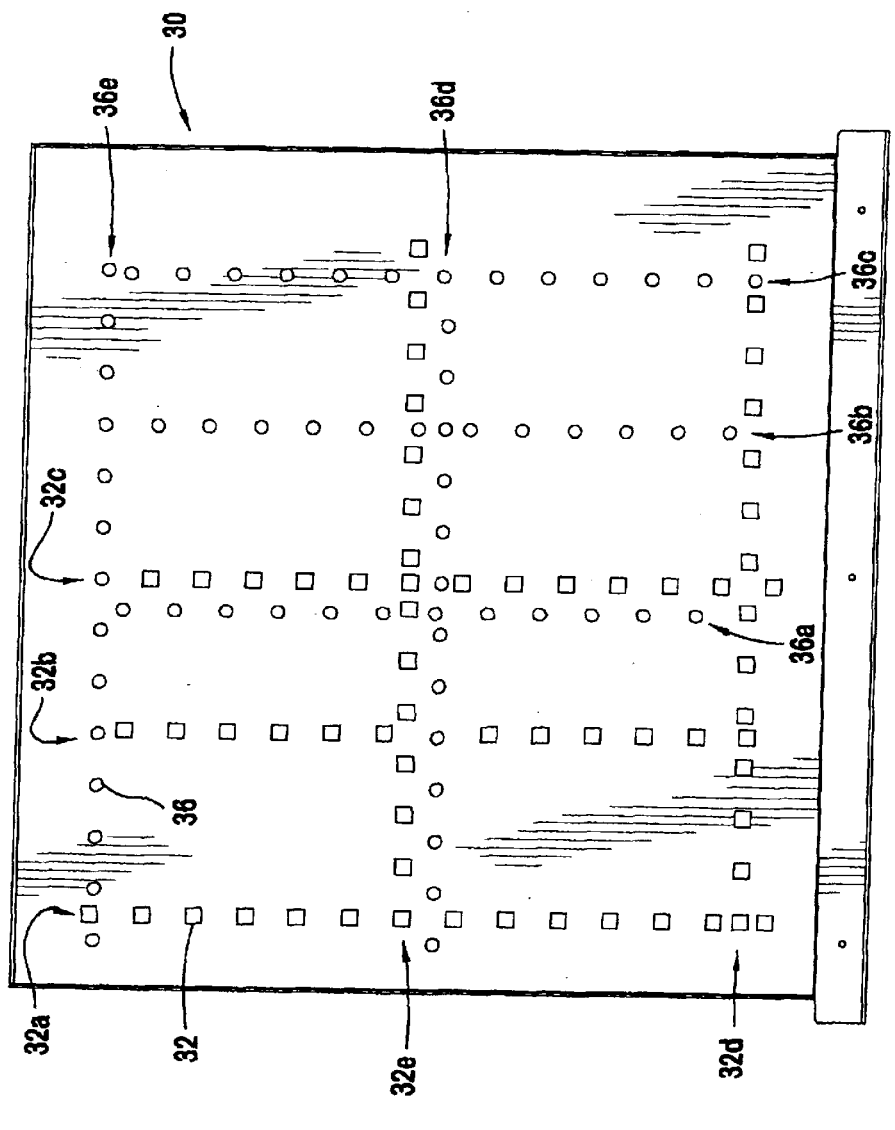
FIG. 6 is a top view of an unpopulated component mounting board utilized in the drawer of FIGS. 1 and 2.

The component mounting board 30 will now be described in greater detail with reference to FIG. 6. The component mounting board may be formed of an insulative or conductive sheet material. A plurality of round openings 36 and a plurality of square openings 32 are strategically positioned in a plurality of columns and rows to allow flexibility in mounting the distribution and control devices 14, 16, 18. It should be understood that each of these distribution and control devices 14, 16, 18 will be mounted to a square opening 32 at a hinged end and a round opening 36 at a securing end as is well known in the art. Therefore, for each mounting orientation at least one square opening 32 and at least one round opening 36 opposite thereto will be utilized. The square openings 32 are arranged in a plurality of vertical columns 32a, 32b, 32c and a plurality of horizontal rows 32e, 32d. Corresponding round openings 36 are arranged in vertical columns 36a, 36b, 36c, and horizontal rows 36d, 36e. These columns and rows act as virtual rails which are oriented so that the distribution and control devices 14, 16, 18 may be mounted in various orientations as follows. Components 14, 16, 18 may be staggered and mounted between columns 32a and 36a, or between columns 32b and 36b or between columns 32c and 36c. Alternatively, these distribution and control devices 14, 16, 18 could be turned to be positioned between rows 32d and 36d or between rows 32e and 36e. As can be appreciated by this description, the distribution and control devices 14, 16, 18 are mountable along the columns in a left, center, or right orientation while they may be mounted perpendicularly along the rows in a top or bottom orientation. Any variety of relative mounting positions may be achieved to have components staggered relative to each other. A board mounted wire manager 20 having a plurality of wire slots 21 may also be provided along the component mounting board 30 as best shown in FIG. 2.

Figure 5:
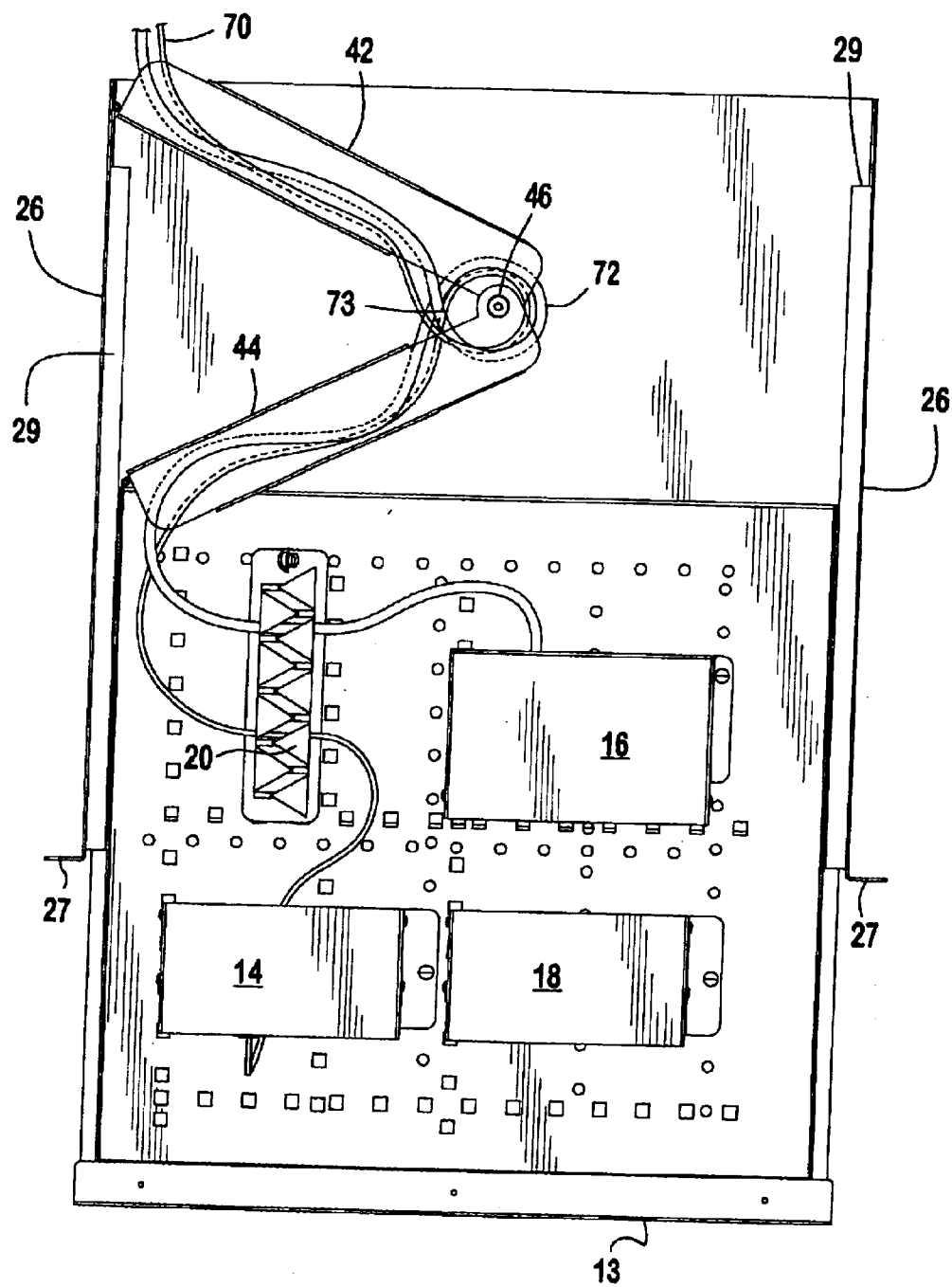
FIG. 5 is a top view of a drawer similar to that of FIG. 4 with the drawer being in an opened position.

The drawers 12 are assembled by inserting the movable portion included within the inner side walls 28 and the front face 13 into the channels 29. The channels 29 are part of a well known slide assembly which is utilized for sliding mounting drawers 12. The hinged wire manager 40 is then applied by connecting hinge 52 to inner side wall 28 and connecting hinge 54 to outer side wall 26 to complete the drawer assembly. Each drawer 12 is then mounted to the rack by inserting suitable fasteners such as bolts or screws in the openings 17 and the openings 25. Wires 70 are then threaded through the hinged wire manager 40 by passing first through the wire receiving passageway 50 and then looping around the hinge pin 46 leaving some slack in a loop 72, crossing over each other at a cross over point 73 and then passing through the wire receiving passageway 48 into the vicinity above the component mounting board 30. It should be understood by those reasonably skilled in the art that although a single wire 70 is shown in FIG. 2 and only two wires 70 are shown in FIG. 5, bundles of wires 70 may be threaded together similarly. The loop 72 is provided around the hinge pin 46 so that the drawer may be easily opened and closed as shown in FIGS. 4 and 5. FIG. 4 shows the drawer 12 in a closed position whereby a first angle is formed between the wires 70 at a cross over point 73. FIG. 5 shows the drawer 12 in an opened position whereby a second angle is formed between the wires 70 at the cross over point 73 by virtue of the fact that the mounted distribution and control devices 14, 16, 18 are farther away from the point where the wires 70 enter into the hinged wire manager 40 and the angle between the arms 42, 44 is increased. The hinged wire manager 40 serves to maintain stability in the portion of the wire 70 that passes therethrough while the hinged wire manager 40 moves from the closed position in FIG. 4 to the open position shown in FIG. 5 and vice versa. The first and second angles between the wires 70 at the cross over point 73 in FIGS. 4 and 5 is relatively less variable than the angle between the arms 42, 44 as the drawers 12 move between the open and closed positions. The total length of wire which resides within the arms 42, 44 also remains relatively unchanged during movement between the open and closed positions.

The advantageous result is that any stresses which are experienced in the wire are spread around a relatively wide area of the loop 72 as opposed to being concentrated in a small area. By maintaining the length of wire 70 within the hinged wire manager 40 and organizing them in a loop 72 and cross over point 73 orientation as shown, localized stresses in the wires 70 are prevented and resistance to opening and closing the drawer 12 due to wire binding or pulling is prevented.

Figure 7:
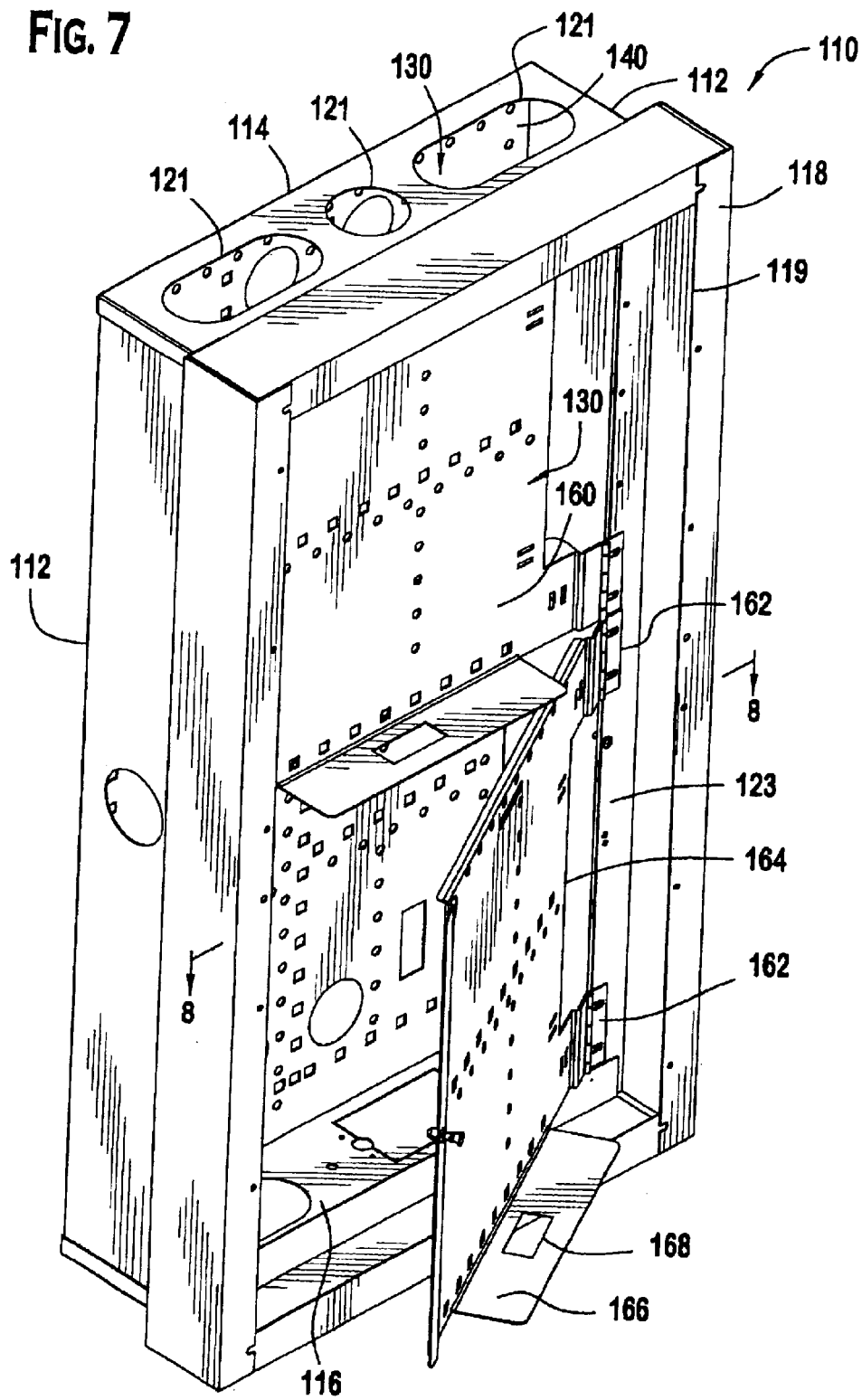
FIG. 7 is a perspective view of an alternate embodiment of a wire and component management system according to the present invention.

An alternate embodiment of the wire and component management system is shown in FIGS. 7 and 8. This embodiment features an enclosure 110 is formed of a pair of side walls 112 which are connected by a top wall 114 and a bottom wall 116. A front face 118 of the enclosure has an opening 119. A door (not shown) is typically provided and connected to the front face 118 to close the opening 119. The top wall 114 has a plurality of wire receiving openings 121. The wire receiving openings 121 are profiled to receive wires or cables of the structured wired system along with wires or cables from the services coming into the service entrance. The enclosure 110 contains a plurality of component mounting boards 130 which are similar to the boards of FIG. 6 in that various distribution and control devices 14, 16, 18 are mountable thereon in a variety of orientations and locations utilizing rows of square and round openings strategically positioned to allow for the alternate orientations. The component mounting boards 130 are positioned in the enclosure 112 at various levels. For example, a first component mounting board 130 is positioned at a first level 140 which is an inner most level. Other component mounting boards 130 are mounted at a second level 160 which is an outer level closer to the opening 119 of the enclosure 110.

The second or outer most level 160 has the component mounting boards 130 being hingably connected to a wall 123 of the enclosure 110 by hinges 162. The hinged edge of these component mounting boards 160 are profiled to have a recess 164. Wires entering through the wire receiving openings are managed and passed through an area between the recess 164 and the wall 123 in order to reach component mounting boards 130 both in the first level 140 and the second level 160. Ledges 166 are provided along the component mounting boards 130 and extend generally orthogonal at an edge. Openings 168 are formed in each ledge 166. Optional components may be mounted on the ledge 166 and strapped thereto through the respective opening 168. As best shown in FIG. 8, cables or wires 170 coming from the wire receiving openings 121 are passed through the area between the recess 164 and the wall 123 in order to reach components mounted on the component receiving board 130 on the second level 160. This allows for the component board 130 on the second level 160 to be rotated about its hinges 162 to the open position shown without disturbing the wires 170 connected to the distribution and control devices 14, 16, 18 mounted thereon. This allows for servicing and reorienting distribution and control devices 14, 16, 18 mounted on the first level 140 component mounting boards 130.

An advantage of the present invention is that it allows for effective wire management into an enclosure of a wire and component management system. The system also advantageously allows for mounting components in various orientations and locations and for expanding by adding additional components to the component boards without disturbing the wires which are effectively managed through the hinge points.

The foregoing illustrates some of the possibilities for practicing the invention. Many other embodiments are possible within the scope and spirit of the invention. It is, therefore, intended that the foregoing description be regarded as illustrative rather than limiting, and that the scope of the invention is given by the appended claims together with their full range of equivalents.

What is claimed is:

1. A wire component management system comprising:

a rack having a plurality of posts;

at least one drawer, being mounted to the posts of the rack, the drawer having a pair of outside walls, a pair of movable side walls and a component mounting board located between and being movable together with the movable side walls; and a hinged wire manager being mounted between one of the movable side walls and one of the outside walls, the hinged wire manager having first and second arms being connected to each other by a hinge having a pin passing through respective pin receiving openings formed in each arm; each arm having a wire receiving passageway defined by top, bottom and side walls and having an opening adjacent the pin; wherein a wire is managed through the hinged wire manager by passing through the wire receiving passageway of the first arm, being looped around the pin, passing through the wire receiving passageway of the second arm and being connected to a component on the component mounting board and the wire exits each opening adjacent the pin and is passed through a crossover point wherein the wire is crossed over itself to close a wire loop around the pin.

2. The wire component management system of claim 1 wherein a length of the wire within the hinged wire manager remains approximately constant through a motion of the component mounting board.

3. The wire component management system of claim 2 wherein the component mounting board has a plurality of square openings arranged in a first set of rows and columns for receiving a hinge end of a component mounted thereon.

4. The wire component management system of claim 3 wherein the component mounting board has a plurality of round openings arranged in a second set of rows and columns being spaced from the first set of rows and columns for receiving a securing end of a component mounted thereon.

* * * * *